(12) United States Patent
Miki et al.

(10) Patent No.: US 8,143,531 B2
(45) Date of Patent: Mar. 27, 2012

(54) ELECTRONIC COMPONENT MOUNTING PACKAGE

(75) Inventors: Syota Miki, Nagano (JP); Tadashi Arai, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 667 days.

(21) Appl. No.: 12/276,772

(22) Filed: Nov. 24, 2008

(65) Prior Publication Data
US 2009/0145636 A1 Jun. 11, 2009

(30) Foreign Application Priority Data
Dec. 5, 2007 (JP) .................................. 2007-314280

(51) Int. Cl.
*H05K 1/16* (2006.01)
(52) U.S. Cl. ........................ 174/260; 174/255; 174/262
(58) Field of Classification Search .................. None
See application file for complete search history.

(56) References Cited

U.S. PATENT DOCUMENTS

| | | | | |
|---|---|---|---|---|
| 5,530,288 A | * | 6/1996 | Stone | 257/700 |
| 5,841,192 A | * | 11/1998 | Exposito | 257/701 |
| 5,893,724 A | * | 4/1999 | Chakravorty et al. | 438/108 |
| 6,071,755 A | * | 6/2000 | Baba et al. | 438/106 |
| 6,418,615 B1 | | 7/2002 | Rokugawa | |
| 6,441,314 B2 | | 8/2002 | Rokugawa | |
| 6,931,724 B2 | | 8/2005 | Rokugawa | |
| 7,462,784 B2 | * | 12/2008 | Kariya et al. | 174/260 |
| 2005/0017271 A1 | | 1/2005 | Rokugawa | |
| 2007/0124924 A1 | | 6/2007 | Nakamura | |

FOREIGN PATENT DOCUMENTS

JP 2000-323613 11/2000
JP 2007-158174 A1 6/2007

* cited by examiner

*Primary Examiner* — Ishwarbhai Patel
(74) *Attorney, Agent, or Firm* — Kratz, Quintos & Hanson, LLP

(57) ABSTRACT

An electronic component mounting package includes a structure (coreless substrate) in which a plurality of wiring layers are stacked one on top of another with insulating layers interposed therebetween and are interconnected through via holes formed in the insulating layers. The entire surface of the coreless substrate, exclusive of pad portions defined at desired positions of the outermost wiring layers thereof, is covered with a molding resin. Further, an interposer is mounted on the side of the electronic component mounting surface of the coreless substrate, and the molding resin is partially filled into a gap between the coreless substrate and the interposer.

3 Claims, 4 Drawing Sheets

ELECTRONIC COMPONENT MOUNTING PACKAGE

CROSS-REFERENCE TO RELATED APPLICATIONS

This application is based on and claims priority of Japanese Patent Application No. 2007-314280 filed on Dec. 5, 2007, the entire contents of which are incorporated herein by reference.

BACKGROUND OF THE INVENTION (a) Field of the Invention

The present invention relates to a wiring board for use in mounting an electronic component such as a semiconductor device. More particularly, the present invention relates to a wiring board (hereinafter referred to as an "electronic component mounting package" or merely as a "package") adapted for mounting an electronic component using a thermosetting material, the wiring board having a structure of a multilayer wiring board in which a plurality of wiring layers are stacked one on top of another with an insulating layer interposed therebetween and are interconnected through via holes formed in the insulating layer.

(b) Description of the Related Art

Conventionally, build-up process has been widely used as a technology for manufacturing a wiring board of multilayer structure. With the use of the build-up process, a variety of multilayer wiring boards can be fabricated by varying the combination of a material (typically, a thermosetting resin) for an interlayer dielectric and a via hole formation process. A typical manufacturing process for the multilayer wiring board using the build-up process is to repeat, in turn, the formation of an insulating layer, the formation of a via hole in the insulating layer, and the formation of a wiring pattern on the insulating layer and also in the via hole, on both or either one surface of a core substrate serving as a support base member. In such a structure, wiring layers and insulating layers can be thinly formed since the build-up process is used for their stacking, while the core substrate requires an appropriate thickness for affording the wiring board rigidity. This leads to a limitation to making the entire package thinner.

In view of this, a structure without a core substrate serving as a support base member has recently been adopted so as to make a wiring board (package) still thinner. The wiring board of such a structure is also referred to as a "coreless substrate" in the meaning that it has no "core" portion.

Although description is given later for a method of manufacturing such a coreless substrate, the basic process thereof includes: preparing a temporary substrate as a support; forming, in sequence, a desired number of build-up layers (namely, insulating layers including via holes, and wiring patterns including the insides of the via holes) on the temporary substrate; and removing the temporary substrate.

An example of a technology related to the above art is disclosed in Japanese unexamined Patent Publication (Kokai) 2000-323613. The technology disclosed in this publication provides a multilayer wiring board for a semiconductor device, and in the multilayer wiring board, a mounting surface on which a semiconductor device is mounted is formed as flat and thin as possible. Another example of a technology related to the above art is disclosed in JPP (Kokai) 2007-158174. The technology disclosed in this publication provides a method of manufacturing a wiring board (coreless substrate) in which a build-up wiring layer is formed on a temporary substrate so as to be delaminatable therefrom, and the method enables reliable, low-cost manufacturing of a wiring board without any problem.

As mentioned above, the conventional coreless substrate (semiconductor package) has an advantage of allowing a reduction in thickness thereof since it does not need any core substrate. On the other hand, the conventional coreless substrate has a disadvantage of being prone to "warpage" since the absence of the core substrate affords the overall package low rigidity. This problem develops more markedly when a chip is mounted on the substrate.

Specifically, in the chip mounting, bumps (electrode terminals) are firstly formed on a chip to be mounted. Thereafter, the electrode terminals of the chip are electrically connected to pad portions exposed from a chip mounting surface of the coreless substrate, by flip chip bonding. Then, an underfill resin is filled into a gap between the substrate and the chip so as to insulate and shield the connection portions therebetween (the pad portions and the electrode terminals) from the outside. At that time, baking (heat treatment) is performed in order to heat-cure the underfill resin. However, this causes a shrinkage in the underfill resin and in turn leads to warpage in the periphery of the substrate toward the chip mounting surface, due to the fact that the coefficient of thermal expansion of the chip is different from that of the substrate.

Thus, in the structure of the conventional coreless substrate (semiconductor package), the low rigidity of the overall package causes a "warpage" during chip mounting, and this can possibly cause chip delamination, depending on the degree of warpage. Accordingly, the structure has a problem in that reliable chip mounting is impossible with the structure. Neither the above JPP (Kokai) 2000-323613 nor 2007-158174 makes reference to such a problem.

Additionally, the timing of the warpage to occur in the substrate is not limited to only the time of chip mounting, but also the warpage may possibly occur even at stages before chip mounting. For example, in the case where a coreless substrate is delivered and then a chip is mounted thereon, the warpage can possibly occur in the substrate, depending on how the substrate is handled during the processes from the delivery to the mounting, because the coreless substrate is intrinsically low in rigidity and flexible.

Moreover, this problem is not necessarily unique to the coreless substrate and may possibly likewise arise in a build-up multilayer wiring board having the core substrate. Specifically, the coefficient of thermal expansion of a material constituting the wiring layer, such as copper (Cu), is significantly different from that of a material constituting the insulating layer, such as an epoxy resin. Thus, the application of the approach of building up the wiring and insulating layers alternatingly with one on top of another to one surface of the core substrate at given intervals of time (namely, the build-up process) can possibly induce thermal stress at the interface between the wiring layer and the insulating layer in the thickness direction of the layers according to the difference in the coefficient of thermal expansion during the process of building up. As a result, the warpage may occur in the substrate.

SUMMARY OF THE INVENTION

An object of the present invention is to provide an electronic component mounting package which are capable of effectively reducing warpage in a substrate that can possibly occur at the time of packaging of an electronic component such as a semiconductor device or at other times, thereby contributing to highly-reliable mounting.

According to the fundamental aspect of the invention, there is provided an electronic component mounting package including: a structure having a plurality of wiring layers stacked one on top of another with an insulating layer interposed therebetween and interconnected through via holes formed in the insulating layers; and a molding resin formed to cover the entire surface of the structure, exclusive of a pad portion defined at a desired position of an outermost wiring layer on a side of an electronic component mounting surface of the structure, and exclusive of a pad portion defined at a desired position of an outermost wiring layer on a side opposite to the electronic component mounting surface.

In the configuration of the electronic component mounting package according to the present invention, the entire surface of the structure (wiring board) is covered with the molding resin, exclusive of a predetermined portion (i.e., the pad portion to which an external terminal is to be connected) of the structure in which the wiring and insulating layers are alternatingly stacked one on top of another. Thereby, the rigidity of the overall substrate is improved. Therefore, the covering of the molding resin provides reinforcement of the overall substrate, and thus enables effective prevention of propagation of a stress, if any, through the substrate, the stress (namely, the stress that can possibly cause warpage in the substrate) induced according to the difference in the coefficient of thermal expansion between the package and an electronic component at the interface therebetween when the electronic component is mounted on the package using a thermosetting material.

This enables an effective reduction in the warpage in the overall substrate, thus eliminating a disadvantage of chip "delamination," such as encountered in the prior art, and thereby enabling highly-reliable chip mounting of the electric component.

Also, the electronic component mounting package according to the above-described aspect may further include an interposer mounted on the side of the electronic component mounting surface and connected to the pad portion, and the molding resin may be partially filled into a gap between the structure and the interposer. In this configuration, the presence of the interposer enables an effective reduction in the influence (namely, the warpage in the substrate) resulting from the difference in the coefficient of thermal expansion when the electronic component is mounted on the wiring board. Also, this configuration makes it possible for the wiring board to enable high-density packaging based on the essential function of the interposer.

Also, according to another aspect of the present invention, there is provided an electronic component mounting package including: a structure having a plurality of wiring layers stacked one on top of another with an insulating layer interposed therebetween and interconnected through via holes formed in the insulating layers; and a wiring board, the entire surface of which is covered with a molding resin, wherein the structure is fixedly mounted on the wiring board.

In the configuration of the electronic component mounting package according to this aspect, as distinct from the electronic component mounting package according to the above-described aspect, the structure itself is not covered directly with the molding resin; however, the entire surface of the wiring board with the structure fixedly mounted thereon is covered with the molding resin. Thereby, the rigidity of the overall package inclusive of the structure can be improved. This enables an effective reduction in the warpage in the overall substrate, thus enabling highly-reliable chip mounting of the electronic component, as in the case of the package according to the above-described aspect.

Description is given of other constructional features and advantages based thereon, of the electronic component mounting package according to the present invention, with reference to embodiments of the present invention to be described hereinafter.

DESCRIPTION OF THE PREFERRED EMBODIMENTS

Description is given below with respect to preferred embodiments of the present invention with reference to the accompanying drawings.

First Embodiment . . . See FIGS. 1 and 2

Figure 1:
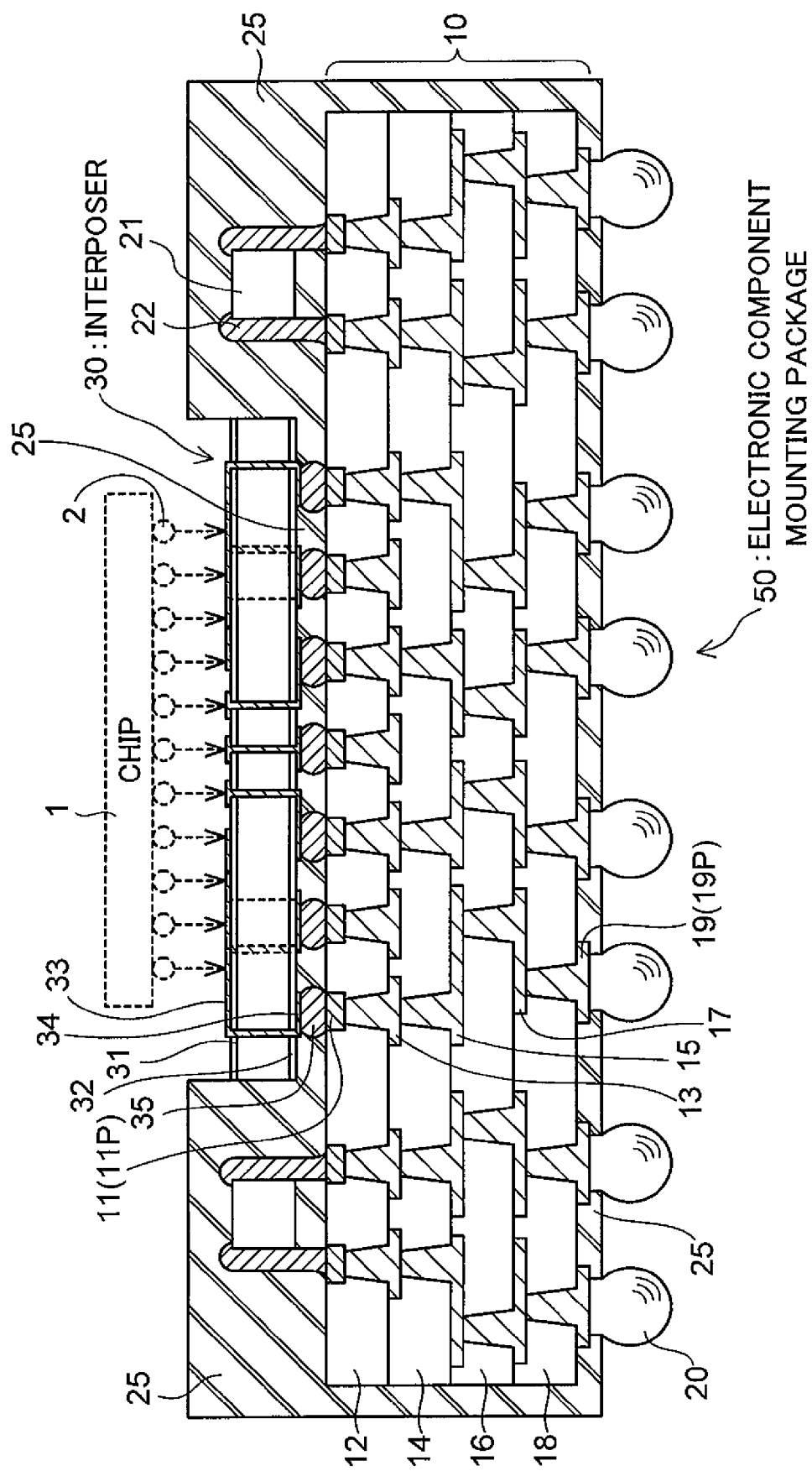
FIG. 1 is a sectional view showing the configuration of an electronic component mounting package according to a first embodiment of the present invention.

FIG. 1 shows, in a sectional form, the configuration of an electronic component mounting package according to a first embodiment of the present invention.

The electronic component mounting package 50 according to this embodiment basically includes: a wiring board (coreless substrate) 10 that does not contain a support base member; and an interposer 30 mounted on the coreless substrate 10. The package 50 according to this embodiment is provided with a chip (typically, a silicon (Si) chip) 1, such as a semiconductor device, mounted on the interposer 30 as shown by the dashed line in FIG. 1, with the interposer 30 mounted on the coreless substrate 10 as shown in FIG. 1. Thereby, the package 50 forms an electronic component device for a semiconductor device or the like.

As shown in FIG. 1, the coreless substrate 10 that constitutes a principal part of the package 50 has a structure in which a plurality of wiring layers 11, 13, 15, 17 and 19 are stacked one on top of another with insulating layers 12, 14, 16 and 18 interposed therebetween and are interconnected through conductors (each of which forms part of a material constituting the wiring layers 13, 15, 17 and 19) filled into via holes formed in the insulating layers 12, 14, 16 and 18, respectively. Pad portions 11P and 19P are defined in predetermined positions of the outermost wiring layers, respectively, of the coreless substrate 10 (in the illustrated example, on the wiring layers 11 and 19). The pad portions 11P and 19P are exposed from both surfaces of the coreless substrate 10 (namely, from the surfaces of the insulating layers 12 and 18).

External connection terminals 20 such as solder balls for use in mounting the package 50 on a printed wiring board (namely, a packaging board) such as a motherboard are bonded to the pad portions 19P exposed from the lower insulating layer 18. Although the external connection terminals 20 are provided in the illustrated example, the provision thereof is not necessarily required. It is essential only that the pad portions 19P be exposed so as to bond to the external connection terminals when necessary. Of course, the surfaces of the pad portions 11P and 19P are given surface treatment such as gold (Au) plating.

Moreover, a required number of chip capacitors 21 (two in the illustrated example) is mounted on the upper surface of the coreless substrate 10 (namely, on the chip mounting surface side thereof). Each of the chip capacitors 21 is connected through a pair of electrode terminals 22 to the pad portions 11P exposed from the upper insulating layer 12. The provision of the chip capacitors 21 is for the purpose of reducing wiring inductance and thereby achieving the desired effect of "decoupling." In this embodiment, the package 50 is configured assuming that the chip 1 to be mounted is a microprocessor (CPU), and the CPU involves a demand for a speedup in processing and hence requires suppression of an increase in the inductance resulting from the wiring length of a signal wire. Therefore, the required number of chip capacitors 21 is provided to achieve the effect of "decoupling" as one means for the suppression.

Further, a molding resin 25 is provided as a member characterizing the present invention, in such a manner as to cover the entire surface of the coreless substrate 10 on which the chip capacitors 21 are mounted. Specifically, as shown in FIG. 1, the molding resin 25 covers the bottom of the coreless substrate 10 (namely, a region thereof exclusive of the pad portions 19P for the bonding to the external connection terminals), the sides, and the top (namely, a region thereof also covering the chip capacitors 21), and further, is filled into a gap between the top of the coreless substrate 10 and the interposer 30.

A thermosetting epoxy resin generally used as a molding resin is used as a material for the molding resin 25 to be filled. The thermosetting epoxy resin to be used has a modulus of elasticity of 10 to 30 GPa and a coefficient of thermal expansion (CTE) of 5 to 15 ppm/° C. Furthermore, the thermosetting epoxy resin contains a filler (e.g., fine particles of inorganic material such as silica, alumina, or calcium silicate), on the order of 70 to 90%, added thereto, in order to adjust the modulus of elasticity of the resin, the CTE thereof, or the like. Besides the thermosetting epoxy resin, a liquid epoxy resin or the like generally used as an underfill resin, for example, may be used. The liquid epoxy resin to be used has a modulus of elasticity of 5 to 15 GPa, CTE of 20 to 40 ppm/° C., and a content of approximately 60 to 80% filler added thereto. Preferably, transfer molding may be used as a filling method for the resin 25. Besides the transfer molding, other methods such as injection molding and underfill flow molding may be used.

The interposer 30 is for implementing a desired fan-out structure between the chip 1 such as the semiconductor device mounted on the interposer 30 and the packaging board (the coreless substrate 10 in this case). The interposer 30 is functionally equivalent to the wiring board. The illustration of the internal configuration of the interposer 30 is omitted, because the interposer 30 is not a member directly related to the present invention.

In this embodiment, silicon (Si) which is a typical semiconductor material is used as a material constituting the interposer 30. This is based on the fact that, when the Si chip 1 is mounted on the interposer 30, the coefficient of thermal expansion of the material constituting the interposer 30 is equal to that of the material constituting the Si chip 1, thus eliminating a disadvantage such as warpage or torsion resulting from a difference in heat shrinkage therebetween. Of course, as the other material constituting the interposer 30, a polyimide resin, an epoxy resin, ceramics, a low-temperature sintering ceramic such as a glass ceramic, or the like may be appropriately used.

Moreover, wiring patterns (for example, plating layers of copper (Cu) plate) 33 and 34 are formed in their respective desired shapes on both surfaces of the interposer 30 with insulating layers 31 and 32 interposed therebetween. The wiring patterns 33 and 34 are electrically connected through via holes formed in the interposer 30 at desired positions (namely, electrical connection across the interposer 30 is ensured). Each of the wiring patterns 33 and 34 is formed so as to contain pad portions in desired positions. In the configuration according to this embodiment, the wiring pattern 33 is formed on the interposer 30 on the side on which the chip 1 is to be mounted, so that the pad portions are defined in the positions corresponding to the positions of electrode terminals 2 (for example, solder bumps, gold (Au) bumps, or the like) on the chip 1 to be mounted. In the meanwhile, the wiring pattern 34 is formed on the interposer 30 on the side opposite to the wiring pattern 33 so that the pad portions are defined in the positions corresponding to the positions of connection terminals 35 such as solder bumps for use in mounting the interposer 30 on the coreless substrate 10. In the illustrated example, the interposer 30 has a structure in which the wiring patterns 33 and 34 are formed one on each side of the interposer 30; however, of course, it will be understood that a build-up process or the like may be used to provide a multi-wiring layer with a higher number of layers as needed.

Additionally, although not shown in FIG. 1, protection films (for example, solder resist layers) are formed on both surfaces of the interposer 30 in such a manner as to cover the surfaces throughout the entire area while exposing the wiring patterns 33 and 34 (pad portions) therefrom. Furthermore, plating layers of nickel (Ni) and gold (Au) are deposited on the wiring patterns (the pad portions) exposed from the protection films.

Although detailed description is omitted with respect to a method of manufacturing the interposer 30, brief description thereof is given below. Specifically, through holes are first formed in a Si wafer in desired positions. Then, the insulating layers 31 and 32 are formed on the inner wall surfaces of the through holes and on the surface of the wafer. Subsequently, seed layers are formed on the insulating layers 31 and 32 and also in the through holes. Thereafter, the via holes are formed by filling conductors into the through holes by electroplating using the seed layers as power feed layers. The plating layers are formed on both surfaces of the wafer, thereby providing connection between the top and bottom of the wafer (or across the wafer). The wiring patterns 33 and 34 are formed on both surfaces of the wafer. Furthermore, the protection films are formed, and the wafer is then diced to be divided into units of interposer. The connection terminals 35 such as the solder bumps are bonded to each interposer. In this manner, the interposer 30 is obtained.

On the other hand, although detailed description is likewise omitted with respect to a method of manufacturing the coreless substrate 10, description thereof is given below by way of example. A process to be described below is excerpted from the second patent document (JPP (Kokai) 2007-158174) previously mentioned. First, a temporary substrate made of copper (Cu) is prepared. A plating resist is formed on the temporary substrate, the plating resist having openings according to the layout of the desired wiring layer (pattern) to be formed. Then, the wiring layer 11 (the pad portions 11P) having, for example, a two-layer construction formed of deposited layers of Au plate and Ni plate, is formed on the temporary substrate (Cu) exposed through the openings in the plating resist layer. The plating resist layer is removed. Subsequently, the insulating layer 12 such as an epoxy resin is formed on the temporary substrate and the wiring layer 11 (pad portions 11P), and the via holes are formed through the insulating layer 12 in desired positions. Thereafter, the desired wiring layer (pattern) 13 is formed by filling the via holes by a semi-additive process or the like, and is connected to the wiring layer 11

(pad portions 11P). After that, the insulating layers 14, 16 and 18 and the wiring layers 15, 17 and 19 are stacked on top of each other by building up the insulating and wiring layers alternatingly with each other, until the required number of layers is reached. Plating of Ni and Au is provided on the surface of the outermost wiring layer 19. Subsequently, the temporary substrate (Cu) is subjected to selective etching away from the wiring layer 11 (whose surface portion has the deposited layer of Au plate formed thereon) and the insulating layer 12. Thus, the coreless substrate 10 is obtained.

In this embodiment, the electronic component mounting package 50 is obtained by manufacturing the coreless substrate 10 and the interposer 30 through the processes, respectively, as mentioned above; mounting the interposer 30 on the upper surface of the coreless substrate 10 (specifically, in a portion thereof corresponding to a region where the chip 1 is to be mounted); and subsequently, performing desired molding (namely, covering the overall coreless substrate 10 with the molding resin 25). Further, an electronic component device such as a semiconductor device can be obtained by mounting an electronic component such as the silicon (Si) chip 1 on the package 50 (specifically, on the interposer 30).

The interposer 30 can be mounted on the coreless substrate 10 in the like manner as in the case of general flip chip bonding connection. Specifically, solder balls as the connection terminals 35 are bonded to the pad portions of the wiring pattern 34 exposed from the lower protection film of the interposer 30, by reflow soldering, (namely, forming the solder bumps); and thus, the interposer 30 is connected to the corresponding pad portions 11P on the coreless substrate 10 through the solder bumps.

With respect to the molding, transfer molding, injection molding, underfill flow molding or other molding methods may be used as in the general practice in the art pertinent to the present invention. In this case, an encapsulation mold (or equivalently, an upper part and a lower part thereof) for use in the molding is shaped into a surface configuration on the side on which the encapsulation mold (or equivalently, each of the upper part and lower part) comes into contact with the coreless substrate 10 so that the molding resin 25 is formed into the configuration shown in FIG. 1.

Moreover, the mounting of the silicon chip 1 on the interposer 30 is accomplished by: connecting, by flip chip bonding, the silicon chip 1 to the pad portions of the wiring pattern 33 exposed from the upper protection film of the interposer 30, in order that the electrode terminals 2 such as the gold bumps bonded onto pads of the silicon chip 1 are electrically connected to the pad portions of the wiring pattern 33; further, filling an underfill resin (for example, an epoxy resin) into a gap between the chip and the protection film; and heat-curing the resin to thereby fix (or mount) the chip.

As described above, according to the configuration of the electronic component mounting package 50 according to this embodiment (see FIG. 1), the entire surface of the coreless substrate 10 with the chip capacitors 21 mounted thereon is covered with the molding resin 25, and thereby, the rigidity of the overall substrate is improved (namely, the overall substrate is reinforced). Therefore, the covering of the molding resin 25 provides reinforcement of the overall substrate. Thus, warpage in the overall substrate can be effectively prevented, even if a stress (namely, a stress that can possibly cause the warpage in the substrate) is induced according to the difference in the coefficient of thermal expansion between the package 50 and the chip 1 at the interface therebetween when the chip 1 is mounted on the package 50 using the underfill resin.

This makes it possible to greatly reduce the warpage in the overall substrate, eliminating a disadvantage of chip "delamination," such as encountered in the prior art, and thereby enabling highly-reliable chip mounting.

Meanwhile, typical interposers are originally designed to be compact and, in general, such an interposer is preferably constructed of a material having the comparable coefficient of thermal expansion to that of the material for a chip, in order to prevent warpage, torsion, wrinkling, or the like, resulting from the difference in the heat shrinkage therebetween when the chip is mounted on the interposer. In this case, it is desirable that silicon (Si) be used as the material constituting the interposer, because silicon is typically used as the material constituting the chip to be mounted.

As opposed to this, in the configuration of the package 50 according to this embodiment, the interposer 30 is integral with the coreless substrate 10 while being fixedly mounted on the coreless substrate 10 that is the essential wiring board, in a portion thereof corresponding to an electronic component mounting region thereof, with the molding resin 25 in between. Since the coreless substrate 10 is reinforced by being covered over the entire outer surface with the molding resin 25 as mentioned above, there is no occurrence of the warpage, the torsion, or the like, resulting from the difference in the heat shrinkage as mentioned above, regardless of the material constituting the interposer 30, even if the interposer 30 is of compact design. In other words, it is not always necessary that the material whose coefficient of thermal expansion is matched to that of the chip to be mounted, be used as the material constituting the interposer 30. Other materials can be used for the interposer 30 with freedom of choice. For example, an insulator material such as a polyimide resin or a glass ceramic may be used.

The interposition of the interposer 30 given the freedom of choice for its material as mentioned above enables an effective reduction in the influence (namely, the warpage in the substrate) resulting from the difference in the coefficient of thermal expansion when the chip 1 is mounted on the wiring board (coreless substrate 10), and also makes it possible for the wiring board 10 to enable high-density packaging (multifunction packaging) based on the essential function of the interposer.

Figure 2:
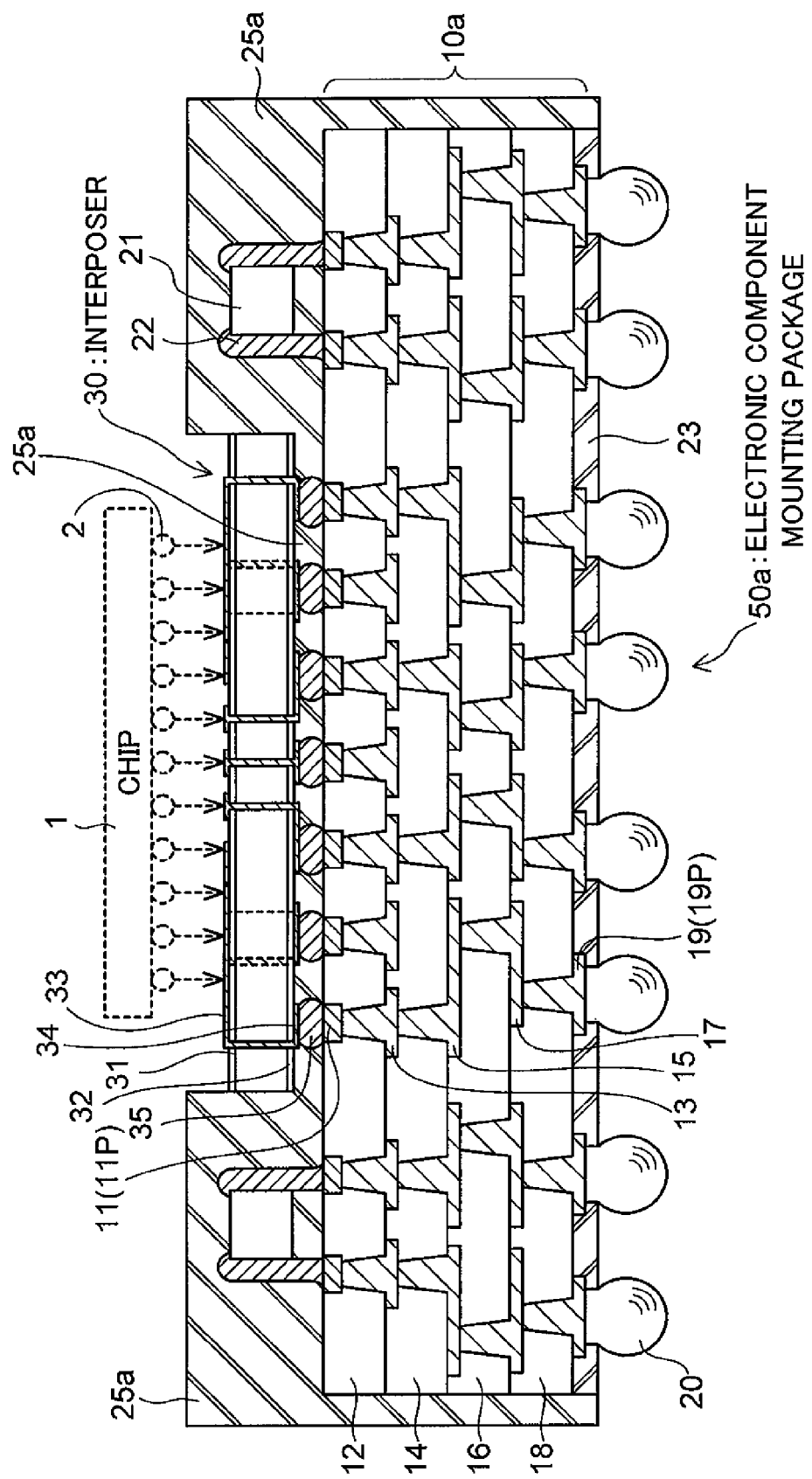
FIG. 2 is a sectional view showing a modified example of the package shown in FIG. 1.

With the configuration of the electronic component mounting package 50 according to this embodiment (see FIG. 1), description is given taking the case where the overall substrate inclusive of the bottom of the coreless substrate 10 (namely, the region exclusive of the pad portions 19P for the bonding to the external connection terminals) is covered with the molding resin 25. Of course, however, the mode of covering of the molding resin is not limited to this, as is also apparent from the gist of the present invention. FIG. 2 shows one modified example thereof.

The configuration of an electronic component mounting package 50a according to this modified example (see FIG. 2) is different from that of the package 50 according to the above-mentioned embodiment (see FIG. 1) in that: an insulating layer (solder resist layer) 23 configured to function as a protection film is formed on a coreless substrate 10a on the side from which its surface layer is exposed (namely, on the side on which the motherboard or the like is disposed); and thus, the overall coreless substrate 10a (namely, the sides and the top (the region also covering the chip capacitors 21), and the gap between the top of the substrate and the interposer 30) is covered with a molding resin 25a exclusive of the bottom of the substrate where the solder resist layer 23 is formed. Since other structural components are the same as those according to the embodiment shown in FIG. 1, description thereof is omitted.

In the modified example, the interposer 30 is mounted on top of the coreless substrate 10a. The solder resist layer 23 having openings is formed on the bottom of the coreless substrate 10a so that the pad portions 19P for the bonding to the external connection terminals are exposed through the openings. Thereafter, molding takes place. Molding method is basically the same as that in the embodiment shown in FIG. 1. However, the modified example is different from the embodiment shown in FIG. 1 in that the lower part of the encapsulation mold for use in the molding has a flat surface which comes into contact with the coreless substrate 10a, although the upper part in the modified example is the same as that in the embodiment shown in FIG. 1.

In the modified example, the coverage area of the molding resin 25a covering the surface of the coreless substrate 10a is less than that of the molding resin 25 according to the embodiment shown in FIG. 1; however, the modified example can achieve equivalent functional effects to those of the embodiment shown in FIG. 1, because the coreless substrate 10a is covered with the solder resist layer 23 which is capable of functioning as the protection film and reinforcing layer despite the reduced area coverage.

Second Embodiment . . . See FIGS. 3 and 4

With the configurations of the electronic component mounting packages 50 and 50a according to the above-mentioned first embodiment and the modified example thereof (see FIGS. 1 and 2), description is given taking the case where the coreless substrates 10 and 10a are directly covered with the molding resins 25 and 25a, respectively, to thereby provide reinforcement to the substrates and thus reduce the warpage therein. Of course, however, the object to be covered with the molding resin is not necessarily limited to any one of the coreless substrates 10 and 10a, as is also apparent from the gist of the present invention. It is essential only that the covering with the molding resin permits an improvement in the rigidity of the overall package. Description is given below with respect to an embodiment in this case.

Figure 3:
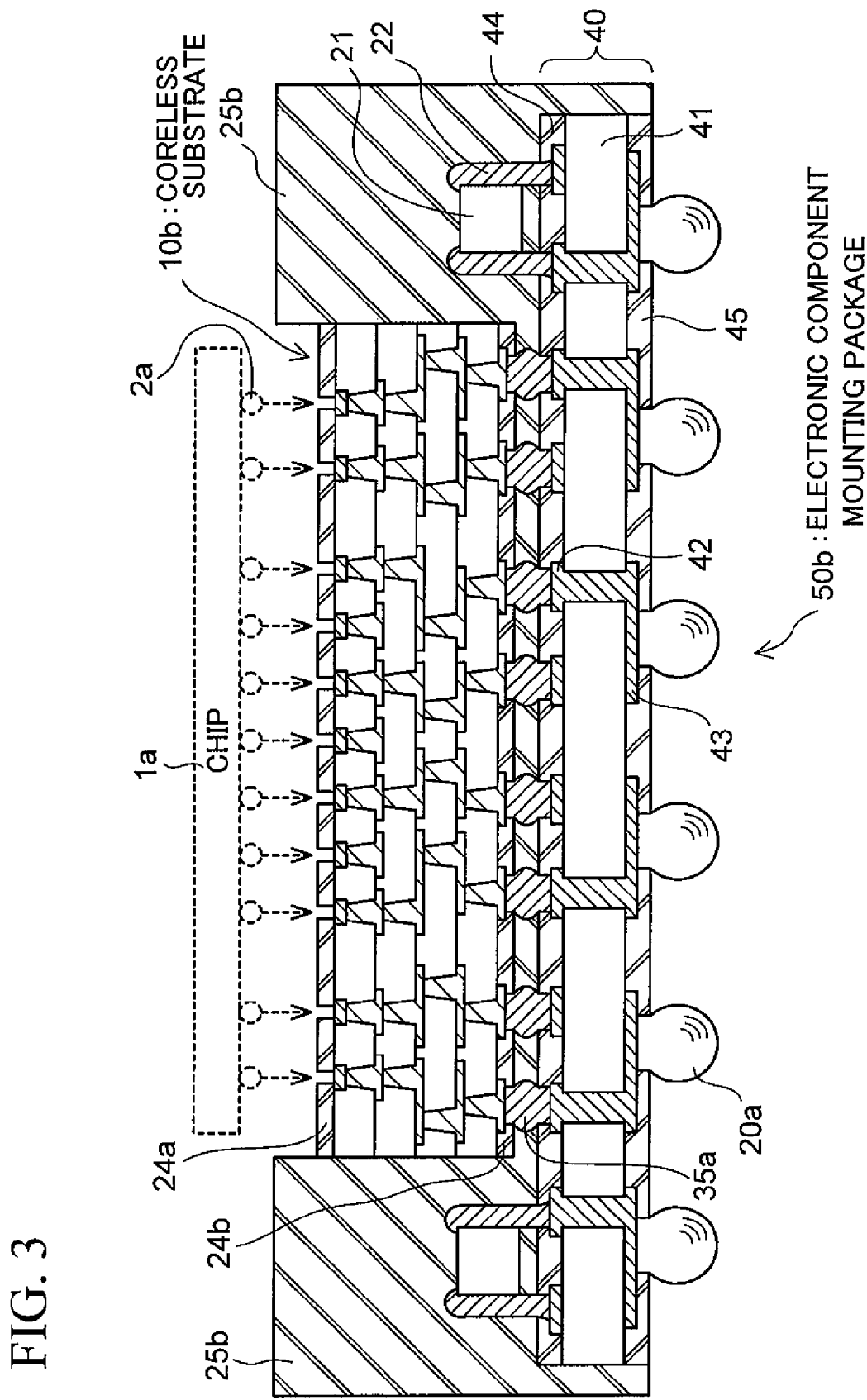
FIG. 3 is a sectional view showing the configuration of an electronic component mounting package according to a second embodiment of the present invention.

FIG. 3 shows, in sectional form, the configuration of an electronic component mounting package according to a second embodiment of the present invention.

As shown in FIG. 3, the electronic component mounting package 50b according to this embodiment includes: a wiring board (coreless substrate) 10b that does not contain a support base member; and a two-layer printed wiring board 40 configured to mount the coreless substrate 10b. The package 50b according to this embodiment is provided with a chip (typically, a silicon (Si) chip) 1a, such as a semiconductor device, mounted on the coreless substrate 10b as shown by the dashed line in FIG. 3, with the coreless substrate 10b mounted on the two-layer printed wiring board 40 as shown in FIG. 3. Thereby, the package 50b forms an electronic component device for a semiconductor device or the like.

The coreless substrate 10b that constitutes the principal part of the package 50b has substantially the same structure as that of the coreless substrate 10, 10a according to the above-mentioned first embodiment and the modified example thereof. Specifically, the coreless substrate 10b has the structure in which a plurality of wiring layers are stacked one on top of another with insulating layers interposed therebetween and are interconnected through conductors (each of which forms part of a material constituting the wiring layers) filled into via holes formed in the insulating layers. Pad portions are defined in predetermined positions on the outermost wiring layers, respectively, of the coreless substrate 10b. The pad portions are exposed from both surfaces of the coreless substrate 10b.

Note, in this embodiment, insulating layers (solder resist layers) 24a and 24b configured to function as protection films are formed on the surface layers of the coreless substrate 10b (namely, on top of the coreless substrate 10b and on the bottom thereof, respectively) so as to cover the surface layers throughout the entire area, exclusive of the pad portions defined in the predetermined positions of the outermost wiring layers. The pad portions exposed from the upper insulating layer 24a of the coreless substrate 10b have flip chip bonding connections to electrode terminals 2a of the chip 1a mounted on the package 50b, through gold bumps or the like. Meanwhile, the pad portions exposed from the lower insulating layer 24b have bonding connections to connection terminals 35a such as solder bumps for use in mounting of the coreless substrate 10b on the two-layer printed wiring board 40.

On the other hand, the two-layer printed wiring board 40 includes a core substrate 41 functioning as the support base member. Wiring layers (for example, deposited layers of copper (Cu) plate) 42 and 43 are formed by patterning into their own desired shapes on both surfaces of the core substrate 41. The wiring layers 42 and 43 are electrically connected via through holes formed in the desired positions in the core substrate 41 at (or through conductors filled into the through holes) (namely, electrical connection across the core substrate 41 is ensured). The wiring layers 42 and 43 are formed so as to contain pad portions in desired positions. Further, insulating layers (solder resist layers) 44 and 45 configured to function as protection films are formed on both surfaces of the core substrate 41 so as to cover the surfaces throughout their entire area, exclusive of the pad portions defined in the predetermined positions on the wiring layers 42 and 43.

In the configuration according to this embodiment, the wiring layer 42 on the side on which the coreless substrate 10b is to be mounted is formed so that the pad portions are defined in the positions corresponding to the positions of the connection terminals 35a such as the solder bumps for use in the mounting of the coreless substrate 10b. Meanwhile, the wiring layer 43 on the side opposite to the wiring layer 42 is formed so that the pad portions are defined in the positions corresponding to the bonded positions of external connection terminals 20a such as solder balls for use in mounting of the package 50b on a packaging board such as a motherboard. Likewise, although the external connection terminals 20a are provided in the illustrated example, the provision thereof is not necessarily required. It is essential only that the pad portions (portions of the wiring layer 43) be exposed so as to permit bonding to the external contact terminals when necessary.

Also, in the configuration of the package 50b according to this embodiment, the required number of chip capacitors 21 is mounted on the upper surface of the two-layer printed wiring board 40. Each of the chip capacitors 21 is connected through a pair of electrode terminals 22 to the pad portions (portions of the wiring layer 42) on the core substrate 41.

Further, a molding resin 25b is provided as a member characterizing the present invention, in such a manner as to cover the entire surface of the two-layer printed wiring board 40 on which the chip capacitors 21 are mounted. Specifically, as shown in FIG. 3, the molding resin 25b covers the sides and the top (namely, a region thereof also covering the chip capacitors 21) of the two-layer printed wiring board 40, exclusive of the bottom of the substrate on which the solder resist layer 45 is formed, and is filled into a gap between the top of the wiring board 40 and the coreless substrate 10b. Since the material and filling method for the molding resin 25b to be filled are the same as those for the above-mentioned first embodiment and the modified example thereof (see FIGS. 1 and 2), description thereof is omitted.

According to the configuration of the electronic component mounting package 50b according to this embodiment (see FIG. 3), the entire surface of the two-layer printed wiring board 40 with the coreless substrate 10b and also the chip capacitors 21 mounted thereon is covered with the molding resin 25b. This enables an improvement in the rigidity of the overall package 50b inclusive of the coreless substrate 10b, as in the case of the above-mentioned first embodiment and the modified example thereof (see FIGS. 1 and 2). Therefore, reinforcement is provided for the two-layer printed wiring board 40 fixedly connected to the coreless substrate 10b. Thus, propagation of a stress through the coreless substrate 10b can be effectively prevented, the stress (namely, the stress that can possibly cause the warpage in the substrate) induced according to the difference in the coefficient of thermal expansion between the coreless substrate 10b and the chip 1a at the interface therebetween when the chip 1a is mounted on the coreless substrate 10b using an underfill resin. This makes it possible to greatly reduce the warpage in the overall substrate and thus enable highly-reliable chip mounting.

Figure 4:
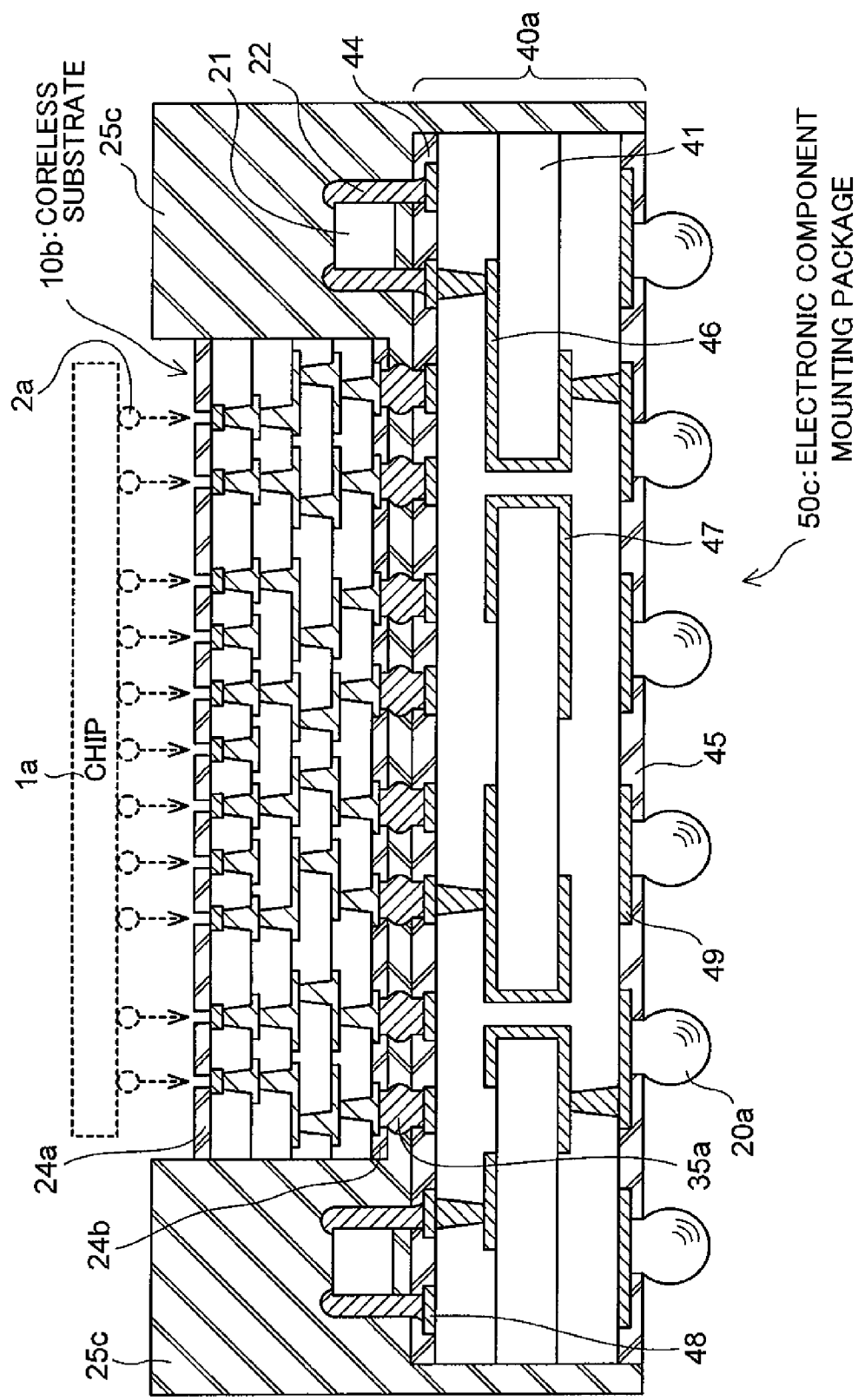
FIG. 4 is a sectional view showing a modified example of the package shown in FIG. 3.

FIG. 4 shows, in sectional form, a modified example of the electronic component mounting package 50b according to the above-mentioned second embodiment.

The configuration of an electronic component mounting package 50c according to the modified example (see FIG. 4) is different from that of the package 50b according to the above-mentioned second embodiment (see FIG. 3) in that the package 50c includes a four-layer printed wiring board 40a as the substrate to mount the coreless substrate 10b thereon. A general build-up process may be likewise used to form the four-layer printed wiring board 40a. Incidentally, in FIG. 4, reference numerals 46 and 47 denote first wiring layers which are provided respectively on both sides of the core substrate 41 (e.g., a double-sided copper-clad substrate); and 48 and 49 denote second wiring layers which are further formed respectively on both sides of the resultant substrate 41 by build-up process. Since other structural components are the same as those of the package 50b according to the embodiment shown in FIG. 3, description thereof is omitted.

The modified example (see FIG. 4) also improves the rigidity of the overall package 50c inclusive of the coreless substrate 10b and thus enables an effective reduction in the warpage in the overall substrate, thereby enabling highly-reliable chip mounting, as in the case of the above-mentioned second embodiment (see FIG. 3).

Incidentally, with respect to the electronic component mounting packages 50b and 50c according to the above-mentioned second embodiment and the modified example thereof (see FIGS. 3 and 4), description is given taking the case where each of the two-layer printed wiring board 40 and the four-layer printed wiring board 40a is used as the board to mount the coreless substrate 10b thereon. Of course, however, it should be understood that the number of layers in the printed wiring board is not limited to two or four.

What is claimed is:

1. An electronic component mounting package comprising:
   a structure including a plurality of wiring layers stacked one on top of another with an insulating layer interposed therebetween and interconnected through via holes formed in the insulating layers, the structure having a first surface and a second surface opposite to the first surface;
   an interposer having a first surface on which an electronic component is to be mounted, and a second surface opposite to the first surface, the interposer being mounted with the second surface thereof facing the first surface of the structure; and
   a molding resin formed to cover the entire surface of the structure, exclusive of pad portions defined in outermost wiring layers on respective sides of the first surface and the second surface of the structure,
   wherein the molding resin is filled into a gap between the structure and the interposer, covers a side surface of the interposer and has a depression for mounting the interposer therewith the depression including a cavity such that the first surface of the interposer is on a level with a bottom surface of the cavity, and
   wherein the interposer is connected via a connection terminal to the pad portion on the first surface of the structure.

2. The electronic component mounting package according to claim 1, further comprising a capacitor mounted around the interposer on the first surface of the structure, the capacitor being embedded in the molding resin surrounding the interposer.

3. The electronic component mounting package according to claim 1, wherein silicon is used as a material constituting the interposer.

* * * * *